(12) United States Patent
Bao et al.

(10) Patent No.: US 11,869,805 B2
(45) Date of Patent: Jan. 9, 2024

(54) SEMICONDUCTOR DEVICE AND METHOD FOR PREPARING SAME, AND STORAGE APPARATUS

(71) Applicant: CHANGXIN MEMORY TECHNOLOGIES, INC., Hefei (CN)

(72) Inventors: Xifei Bao, Hefei (CN); Fang Rong, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 381 days.

(21) Appl. No.: 17/409,998

(22) Filed: Aug. 24, 2021

(65) Prior Publication Data

US 2022/0076994 A1 Mar. 10, 2022

Related U.S. Application Data

(63) Continuation of application No. PCT/CN2021/100731, filed on Jun. 17, 2021.

(30) Foreign Application Priority Data

Sep. 7, 2020 (CN) .......................... 202010928257.9

(51) Int. Cl.
*H01L 21/768* (2006.01)
*H01L 21/308* (2006.01)
(Continued)

(52) U.S. Cl.
CPC ........ *H01L 21/76802* (2013.01); *G11C 5/025* (2013.01); *H01L 21/308* (2013.01);
(Continued)

(58) Field of Classification Search
CPC ... H01L 21/76802; H01L 28/90; H01L 28/60; H10B 12/03; H10B 12/30; H10B 12/033
See application file for complete search history.

(56) References Cited

U.S. PATENT DOCUMENTS 7,271,051 B2 9/2007 Manning
7,288,454 B2 10/2007 Lee
(Continued)

FOREIGN PATENT DOCUMENTS

CN 106098693 A 11/2016
CN 104979186 B 2/2018
(Continued)

*Primary Examiner* — Bac H Au
(74) *Attorney, Agent, or Firm* — Cooper Legal Group, LLC

(57) ABSTRACT

A method for preparing method semiconductor device includes: providing a wafer on which a semiconductor structure is formed; forming a stacked film layer structure on a side of the semiconductor structure away from the wafer, a film layer in the stacked film layer structure farthest from the semiconductor structure being a first film layer; reducing a thickness of the first film layer so that the thickness of the first film layer at where orthographic projection of the first film layer on the wafer locates at an edge of the wafer is less than the thickness of the first film layer at where orthographic projection of the first film layer on the wafer locates in middle of the wafer; and patterning the stacked film layer structure to form through holes which communicate to the semiconductor structure.

11 Claims, 13 Drawing Sheets

(51) Int. Cl.
  *G11C 5/02*     (2006.01)
  *H01L 49/02*    (2006.01)
  *H10B 12/00*    (2023.01)

(52) U.S. Cl.
  CPC ............ *H01L 28/60* (2013.01); *H10B 12/03* (2023.02); *H10B 12/30* (2023.02)

(56) References Cited

U.S. PATENT DOCUMENTS

| | | | |
|---|---|---|---|
| 7,459,745 B2 | 12/2008 | Lee | |
| 10,475,796 B1* | 11/2019 | Wang | H10B 12/34 |
| 2006/0033137 A1 | 2/2006 | Lee | |
| 2006/0063344 A1 | 3/2006 | Manning | |
| 2008/0023745 A1 | 1/2008 | Lee | |
| 2011/0201203 A1* | 8/2011 | Lee | H01L 21/76814 |
| | | | 257/E21.252 |
| 2012/0205779 A1* | 8/2012 | Kim | H10B 12/033 |
| | | | 257/532 |
| 2014/0256112 A1* | 9/2014 | Park | H10B 12/03 |
| | | | 438/397 |
| 2015/0056805 A1* | 2/2015 | Park | H01L 21/76804 |
| | | | 438/672 |
| 2016/0322376 A1 | 11/2016 | Lee | |
| 2020/0105540 A1* | 4/2020 | Park | H01L 21/31058 |
| 2020/0152634 A1* | 5/2020 | Lee | H01L 21/311 |
| 2020/0194437 A1* | 6/2020 | Song | H01L 21/76838 |
| 2020/0212058 A1* | 7/2020 | Wei | H10B 43/27 |

FOREIGN PATENT DOCUMENTS

| | | |
|---|---|---|
| CN | 107706206 A | 2/2018 |
| CN | 107895721 A | 4/2018 |
| CN | 109817623 A | 5/2019 |

* cited by examiner

SEMICONDUCTOR DEVICE AND METHOD FOR PREPARING SAME, AND STORAGE APPARATUS

CROSS-REFERENCE TO RELATED APPLICATIONS

The present application is a U.S. continuation application of International Application No. PCT/CN2021/100731, filed on Jun. 17, 2021, which claims priority to Chinese Patent Application No. 202010928257.9, filed on Sep. 7, 2020. International Application No. PCT/CN2021/100731 and Chinese Patent Application No. 202010928257.9 are incorporated herein by reference in their entireties.

TECHNICAL FIELD

The disclosure relates to the technical field of semiconductors, in particular to a semiconductor device, a method for preparing the same, and a storage apparatus including the semiconductor device.

BACKGROUND

A dynamic random access memory (DRAM) is a semiconductor storage device commonly used in a computer, and is composed of many repeated memory units. Each of memory units usually includes a capacitor and a transistor. A gate of the transistor is connected to a word line, a drain of the transistor is connected to a bit line, and a source of the transistor is connected to the capacitor. A voltage signal of the word line controls the transistor to be switched on or switched off, so that data information stored in the capacitor is read through the bit line, or the data information is written into the capacitor through the bit line for storage.

With the development and advancement of technologies, the DRAM is increasingly miniaturized, and capacitors therein are increasing smaller in term of a geometric size according to the Moore's law, and a depth-to-width ratio of capacitors is relatively large, even exceeding 50:1. Due to non-uniform plasmas in a cavity in an etching process, there is a difference in etching between an edge of a wafer and the middle of the wafer, and finally a through hole that receives a capacitance structure formed at the edge of the wafer has a shrinkage defect. As the through hole that receives the capacitance structure formed at the edge of the wafer has the shrinkage defect, the capacitance structure subsequently formed in the through hole cannot be connected to a capacitance contact structure, thereby decreasing the yield of the device.

It should be noted that the information disclosed in the background section above is only used to enhance the understanding of the background of the disclosure, and therefore may include information that does not constitute the prior art known to those of ordinary skill in the art.

SUMMARY

The disclosure is directed to overcome the deficiency of easy occurrence of a shrinkage defect in the related art and provide a semiconductor device that is unlikely to have the shrinkage defect, a method for preparing the semiconductor device, and a storage apparatus including the semiconductor device.

According to one aspect of the disclosure, a method for preparing a semiconductor device includes following operations.

A wafer on which a semiconductor structure is formed is provided.

A stacked film layer structure is formed on a side of the semiconductor structure away from the wafer. A film layer in the stacked film layer structure farthest from the semiconductor structure is a first film layer.

A thickness of the first film layer is reduced so that the thickness of the first film layer at where orthographic projection of the first film layer on the wafer locates at an edge of the wafer is less than a thickness of the first film layer at where orthographic projection of the first film layer on the wafer locates in the middle of the wafer.

The stacked film layer structure is patterned to form through holes which communicate to the semiconductor structure.

According to one aspect of the disclosure, a semiconductor device is provided, prepared by any one of the above-mentioned methods.

According to one aspect of the disclosure, a memory is provided, including any one of the above-mentioned semiconductor devices.

It can be known from the above-mentioned technical solutions that the disclosure has at least one of the following advantages and active effects.

It should be understood that the above general description and the following detailed description are exemplary and explanatory only, and are not intended to limit the disclosure.

BRIEF DESCRIPTION OF THE DRAWINGS

The accompanying drawings, which are incorporated in and constitute a part of this specification, illustrate embodiments consistent with the disclosure and, together with the specification, serve to explain the principles of the disclosure. Apparently, the drawings in the following description are only some embodiments of the disclosure. Those of ordinary skill in the art can further obtain other drawings based on these drawings without creative work.

Figure 1:
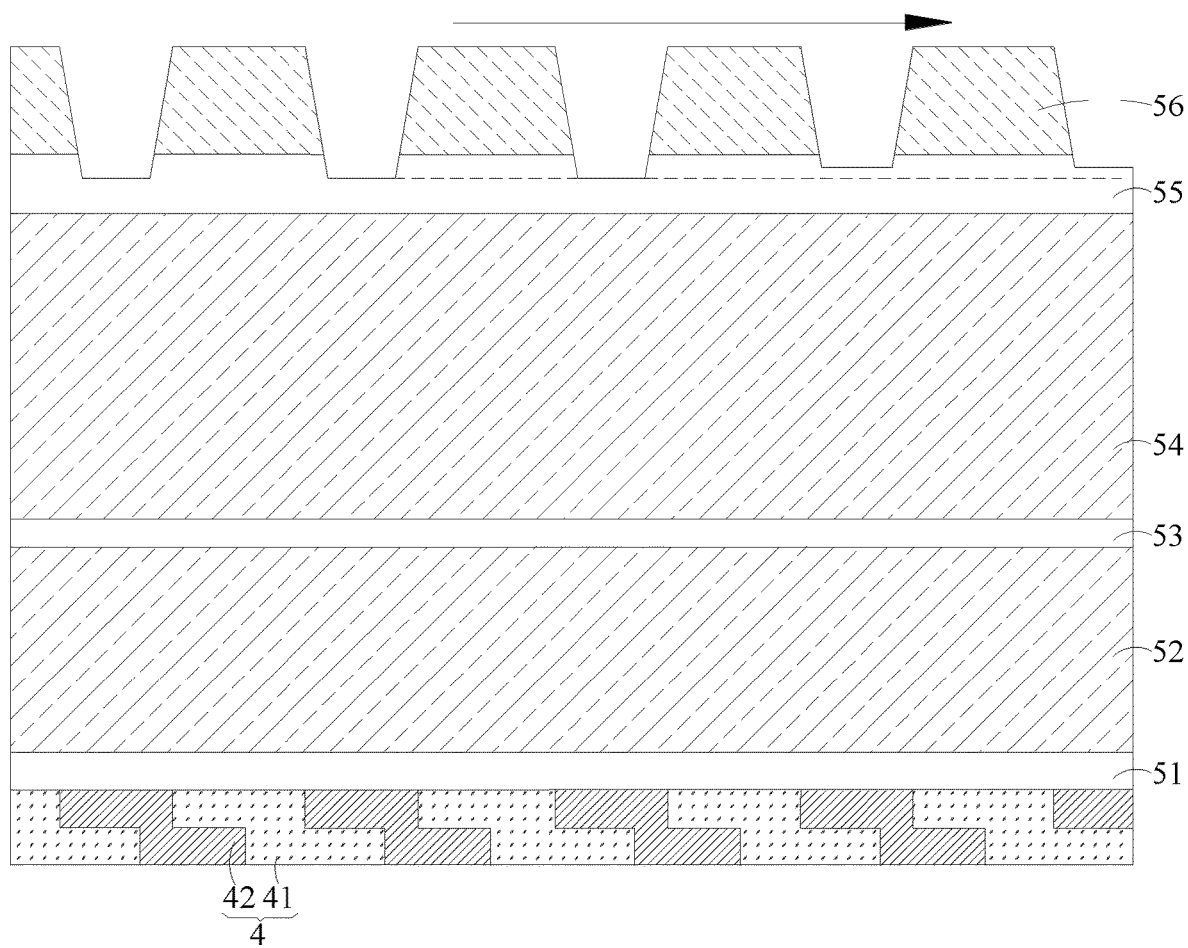
FIG. 1 is a schematic structural diagram of a semiconductor device at the beginning of etching in the related art.

Reference signs of main elements in the drawings are described below.

1: polishing pad; 2: polishing liquid nozzle; 3: grinding head;
4: semiconductor structure; 41: capacitance contact isolation layer; 42: capacitance contact structure;
5: stacked film layer structure; 51: first insulation layer; 52: first supporting layer; 53: second insulation layer; 54: second supporting layer; 55: third insulation layer; 56: dielectric layer; 57: third supporting layer;
6: mask layer; 7: photoresist layer; 8: through hole; 9: blind hole; 10: polymer.

DETAILED DESCRIPTION

Example implementation modes will be now described more comprehensively with reference to the accompanying drawings. However, the example implementation modes can be implemented in a variety of forms and should not be construed as being limited to the implementation modes set forth herein. Rather, these implementation modes are provided to make the disclosure more comprehensive and complete, and fully convey the concept of the example implementation modes to those skilled in the art. The same reference signs in the drawings denote the same or similar structures, and a repetitive description thereof will be omitted.

Figure 2:
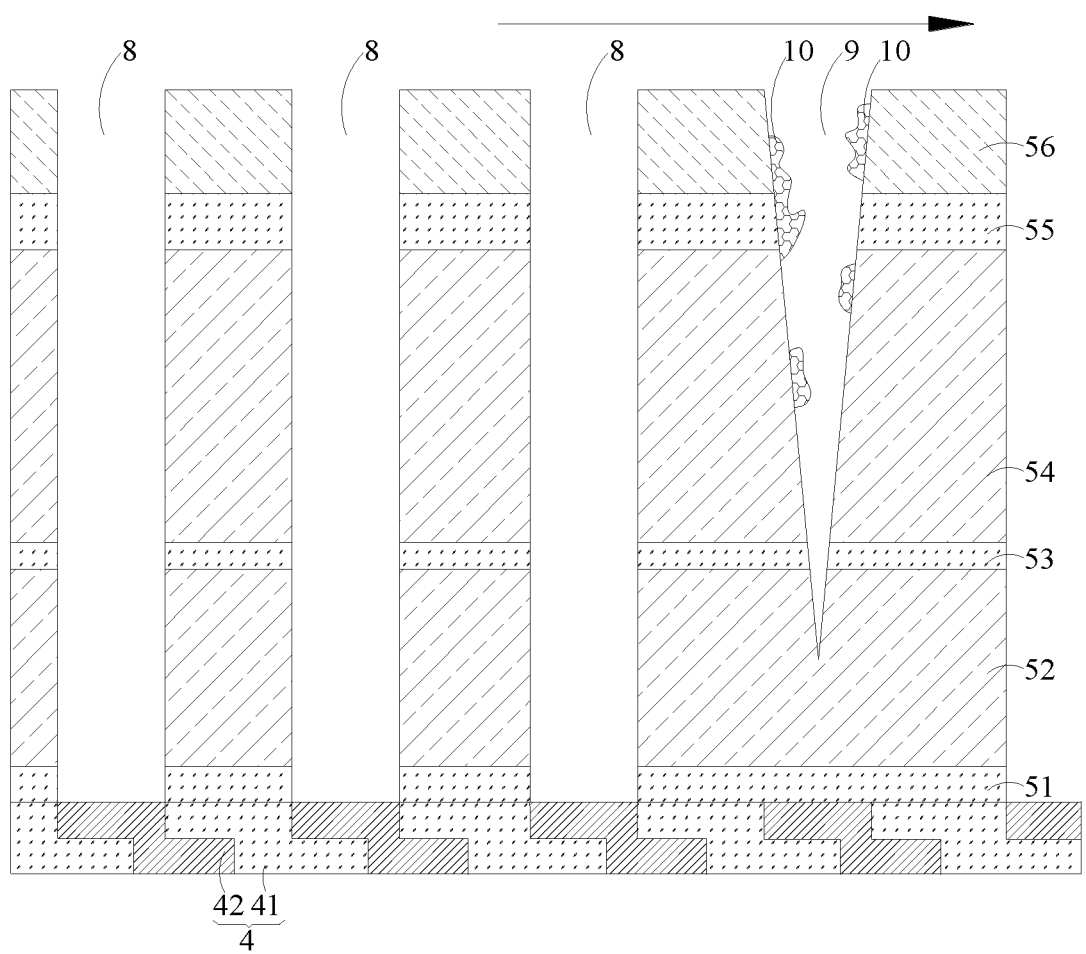
FIG. 2 is a schematic structural diagram after etching of a semiconductor device in FIG. 1.
Figure 3:
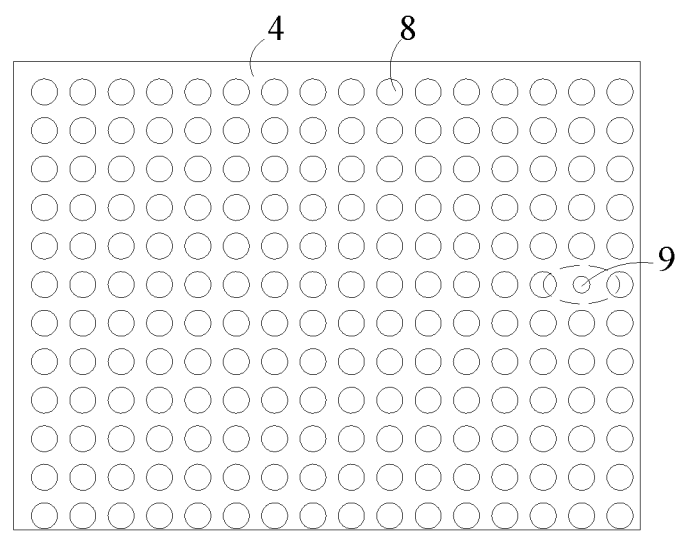
FIG. 3 is a top view of FIG. 2.

Referring to FIG. 1, which shows the schematic structural diagram of a semiconductor device at the beginning of etching in the related art, it can be seen from comparison by the dotted lines in the figure that after a dielectric layer 56 and part of a third insulation layer 55 are etched, due to non-uniform plasmas in a cavity in an etching process, a depth of a hole formed in an edge of a wafer is relatively small. Referring to FIG. 2, which shows the schematic structural diagram of a semiconductor device after etching in the related art, it can be seen from the figure that only a blind hole 9 is formed at the edge of the wafer, and a polymer 10 is attached to an inner wall of the etched blind hole 9, resulting in a shrinkage defect, so that a subsequently formed capacitance structure cannot be connected to a capacitance contact structure 42, thereby decreasing the yield of the semiconductor device. Referring to FIG. 3, which shows the top view of a semiconductor device after etching in the related art, it can be seen from the figure that the diameter of the hole in the dashed frame, which is the blind hole 9 having the shrinkage defect, is less than the diameters of other holes. The arrows in FIG. 1 and FIG. 2 point to the side of the edge of the wafer.

Figure 4:
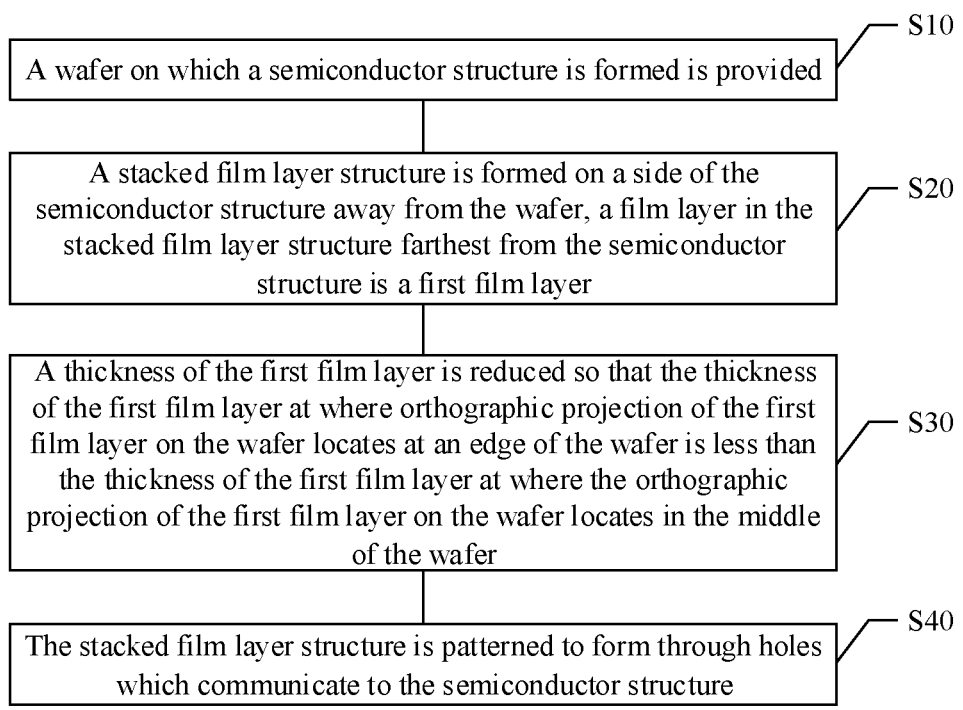
FIG. 4 is a schematic flowchart of one example implementation mode of a method for preparing a semiconductor device of the disclosure.

The disclosure firstly provides a method for preparing a semiconductor device. Referring to FIG. 4, the method for preparing the semiconductor device may include the following operations.

At S10, a wafer is provided. A semiconductor structure 4 is formed on the wafer.

At S20, a stacked film layer structure 5 is formed on a side of the semiconductor structure 4 away from the wafer. A film layer in the stacked film layer structure 5 farthest from the semiconductor structure 4 is the first film layer.

At S30, the thickness of the first film layer is reduced so that the thickness of the first film layer at where orthographic projection of the first film layer on the wafer locates at an edge of the wafer is less than a thickness of the first film layer at where the orthographic projection of the first film layer on the wafer locates in the middle of the wafer.

At S40, the stacked film layer structure 5 is patterned to form through holes 8 which communicate to the semiconductor structure 4.

All the operations of the method for preparing a semiconductor device provided in the embodiments of the disclosure will be described below in detail.

The arrows in all the figures point to the side of the edge of the wafer.

At S10, a wafer (not shown) is provided. A semiconductor structure 4 is formed on the wafer.

Figure 5:
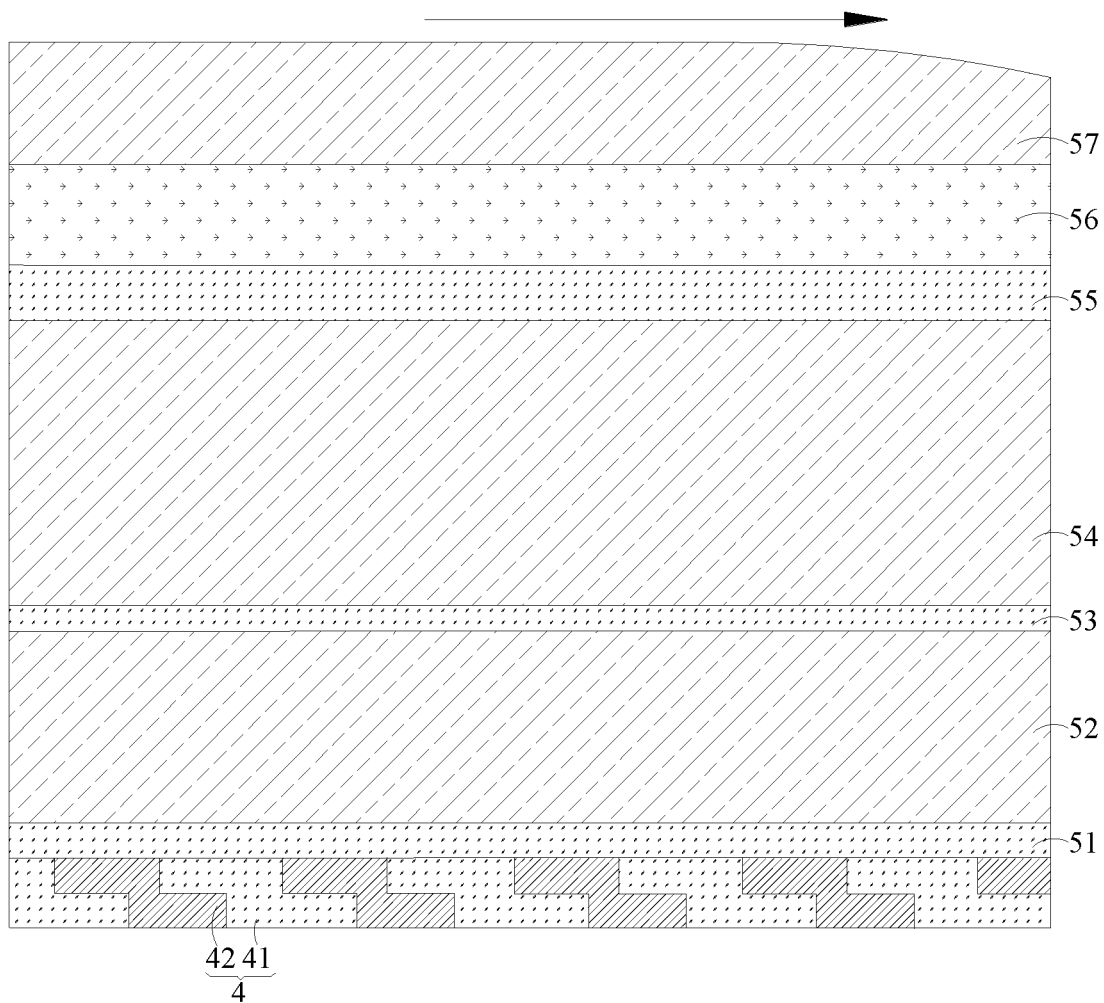
FIG. 5 is a schematic structural diagram of a semi-finished product of a semiconductor device with a stacked film layer structure deposited.

In the example implementation mode, referring to FIG. 5, the semiconductor structure 4 includes a capacitance contact isolation layer 41 and a capacitance contact structure 42. At least one surface of the capacitance contact structure 42 is exposed. The semiconductor structure 4 further includes a transistor, a word line, a bit line, and other semiconductor devices. As these semiconductor devices are not involved in the technical features of the disclosure, they are not shown in the figures.

At S20, a stacked film layer structure 5 is formed on a side of the semiconductor structure 4 away from the wafer. A film layer in the stacked film layer structure 5 farthest from the semiconductor structure 4 is the first film layer.

In the example implementation mode, continuously referring to FIG. 5, the operation that a stacked film layer structure 5 is formed on a side of the semiconductor structure 4 away from the wafer may include the following operations. A first insulation layer 51 is deposited on a side of the semiconductor structure 4 away from the wafer. A material of the first insulation layer 51 may be silicon nitride, nitrogen silicon boride, etc. A thickness of the first insulation layer 51 is 10 to 20 nm. A first supporting layer 52 is deposited on a side of the first insulation layer 51 away from the semiconductor structure 4. A material of the first supporting layer 52 may be silicon oxide, silicon oxynitride, etc. A thickness of the first supporting layer 52 is about 50 to 100 nm. A second insulation layer 53 is deposited on a side of the first supporting layer 52 away from the semiconductor structure 4. A material of the second insulation layer 53 may be silicon nitride, silicon carbonitride, etc. A thickness of the second insulation layer 53 is 10 to 20 nm. A second supporting layer 54 is deposited on a side of the second insulation layer 53 away from the semiconductor structure 4. A material of the second supporting layer 54 may be silicon oxide, silicon oxynitride, etc. A thickness of the second supporting layer 54 is about 50 to 100 nm. A third insulation layer 55 is deposited on a side of the second supporting layer 54 away from the semiconductor structure 4. A material of the third insulation layer 55 may be silicon nitride, silicon carbonitride, etc. A thickness of the third insulation layer 55 is 10 to 20 nm. A dielectric layer 56 is deposited on a side of the third insulation layer 55 away from the semiconductor structure 4. A material of the dielectric layer 56 may be a carbon thin film, a silicon thin film, etc. A thickness of the dielectric layer 56 is 30 to 50 nm. A third supporting layer 57 may be deposited on a side of the dielectric layer 56 away from the semiconductor structure 4. A material of the third supporting layer 57 may be silicon oxide. A thickness of the third supporting layer 57 is about 80 to 150 nm. The third supporting layer 57 is the first film layer. Since the silicon oxide is soft, which is easy to grind, the third supporting layer 57 is used as the first film layer for thinning. Of course, in other example implementation modes of the disclosure, a subsequently formed mask layer 6 may also be used for thinning. Also, the third insulation layer 55, the second supporting layer 54, etc. may be used for thinning.

At S30, a thickness of the first film layer is reduced so that a thickness of the first film layer at where orthographic projection of the first film layer on the wafer locates at an edge of the wafer is less than a thickness of the first film layer at where the orthographic projection of the first film layer on the wafer locates in the middle of the wafer.

Figure 6:
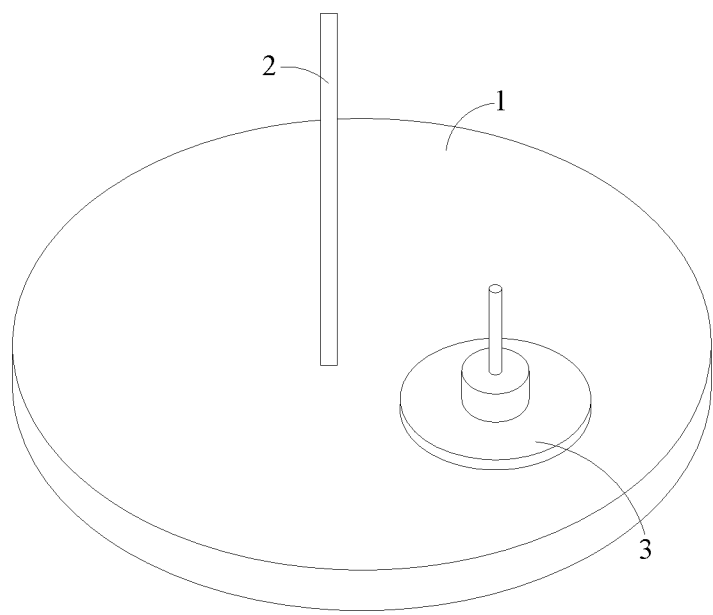
FIG. 6 is a schematic structural diagram of a semi-finished product of a semiconductor device with the first film layer thinned on the basis of FIG. 5.

Referring to FIG. 6, after the thickness of the first film layer (the third supporting layer 57) is reduced, the first film layer (the third supporting layer 57) at where the orthographic projection of the first film layer locates at the edge of the wafer has an annular arc surface away from the semiconductor structure 4, and is thinner when a distance of the first film layer from a center point of the wafer is greater. That is, the arc surface of the first film layer is curved towards the semiconductor structure 4.

In the example implementation mode, the edge of the wafer is a part that is away from the center point of the wafer by a distance greater than or equal to six sevenths (6/7) of a radius of the wafer, and the middle of the wafer is a part that is away from the center point of the wafer by a distance less than six sevenths (6/7) of the radius of the wafer. For example, when the radius of the wafer is 150 mm, the edge of the wafer is a circular ring part that is away from a center position of the wafer by a distance greater than or equal to 129 mm, and the middle of the wafer is a circular part that is away from the center position of the wafer by a distance less than 129 mm. Of course, in other example implementation modes of the disclosure, the position and size of the edge of the wafer may be set according to an actual situation, and are not limited to the above-mentioned illustration.

An edge of a grinding head 3 corresponds to the edge of the wafer, and the middle of the grinding head 3 corresponds to the middle of the wafer. That is, a diameter of the grinding head 3 may be the same as a diameter of the wafer. Orthographic projection of the edge of the grinding head 3 on the wafer overlaps the edge of the wafer, and orthographic projection of the middle of the grinding head 3 on the wafer overlaps the middle of the wafer.

Figure 7:
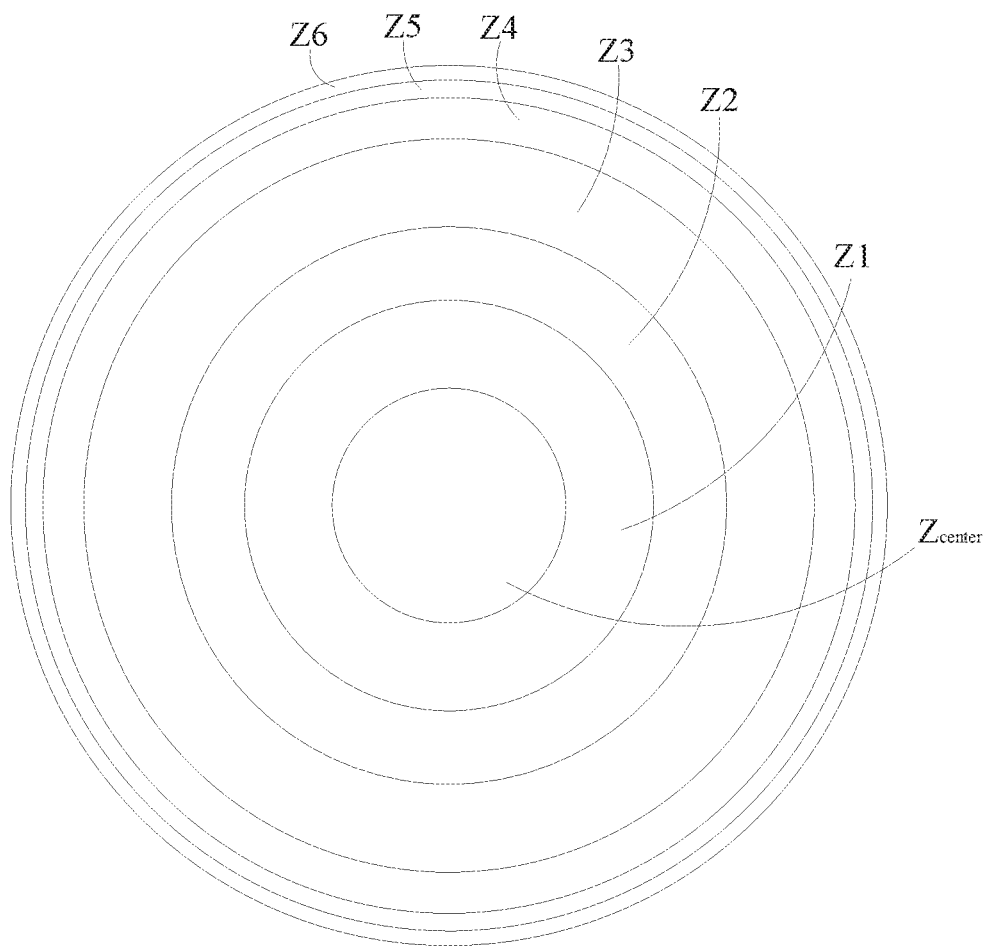
FIG. 7 is a schematic structural diagram of a double-shaft chemical mechanical grinding device.

In the example implementation mode, the thickness of the first film layer may be reduced by a chemical mechanical grinding process. Specifically, during grinding of the first film layer, a pressure of the edge of the grinding head 3 of chemical mechanical grinding device is increased so that the pressure is greater than a pressure of the middle of the grinding head 3. That is, the first film layer is ground by double-shaft chemical mechanical grinding device to reduce the thickness of the first film layer. The chemical mechanical grinding device is different from a traditional purely mechanical or chemical polishing method. The chemical mechanical grinding device avoids the shortcomings of surface damage caused by pure mechanical polishing, low polishing speed, low surface flatness, low polishing consistency, etc. easily caused by pure chemical polishing by means of integration of a chemical method and a mechanical method. In the chemical mechanical grinding device, a "soft grind hard" principle, that is, a soft material is applied for polishing to realize high-quality surface polishing, is used. Polishing liquid of the chemical mechanical grinding device is a high-purity low-metal-ion type polishing product produced by taking high-purity silicon powder as a raw material via a special process, and is widely applied to nano-level high-flatness polishing for various materials. Referring to FIG. 7, the double-shaft chemical mechanical grinding device may include a polishing pad 1, a polishing liquid nozzle 2, and a grinding head 3. The polishing pad 1 can rotate, and the grinding head 3 can also rotate and apply a pressure. The grinding head 3 adsorbs the wafer provided with the stacked film layer structure 5, and enables the first film layer to be fitted to the polishing pad 1. The polishing liquid nozzle 2 sprays polishing liquid. The polishing pad 1 rotates, and the grinding head 3 also rotates and applies a pressure to the wafer provided with the stacked film layer structure 5, so as to reduce the thickness of the first film layer and make the thickness of the first film layer at where the orthographic projection of the first film layer on the wafer locates at the edge of the wafer less than the thickness of the first film layer at where the orthographic projection of the first film layer on the wafer locates in the middle of the wafer.

Figure 8:
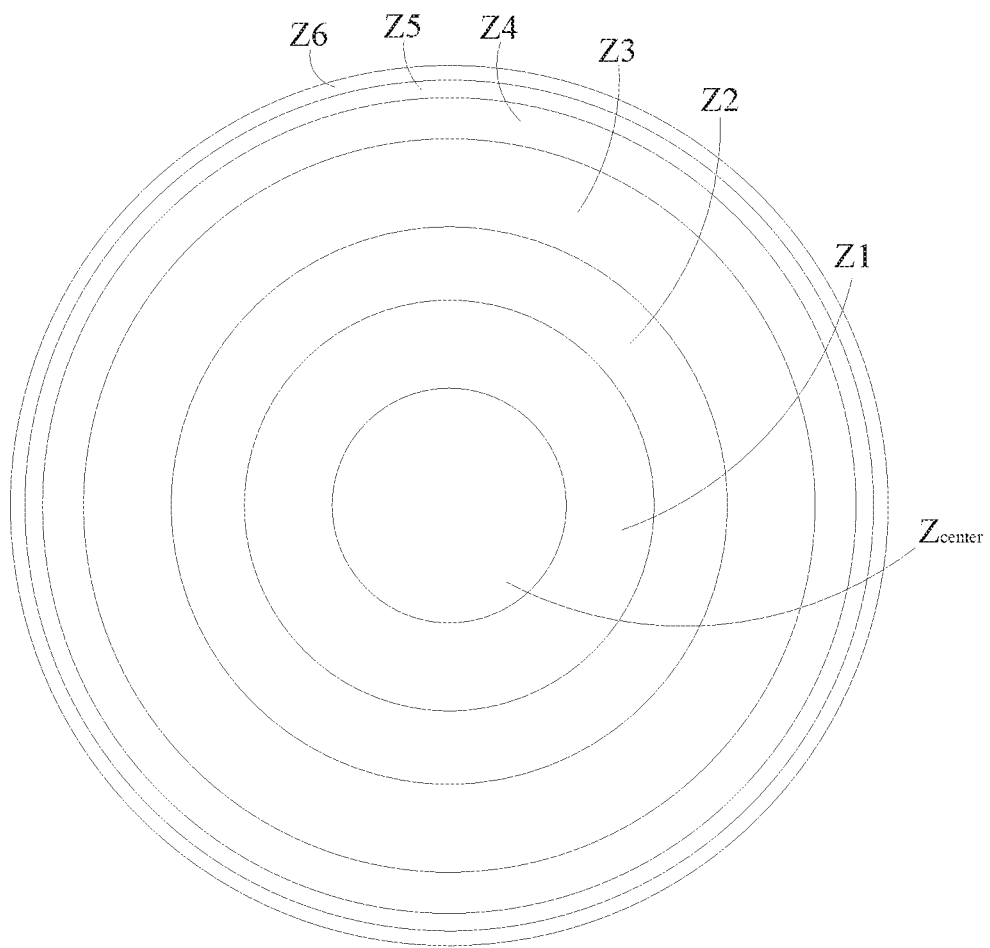
FIG. 8 is a schematic structural diagram of partitioning of the grinding head in FIG. 7.

In the example implementation mode, referring to FIG. 8, the grinding head 3 may be divided into one center region $Z_{center}$ and six annular regions which are concentrically disposed. The six annular regions are respectively a first annular region Z1, a second annular region Z2, a third annular region Z3, a fourth annular region Z4, a fifth annular region Z5, and a sixth annular region Z6. A radius of the center region $Z_{center}$ is about 40 mm. The inner ring of the first annular region Z1 is connected to the center region $Z_{center}$. The radius of the outer ring of the first annular region Z1 is about 70 mm. The inner ring of the second annular region Z2 is connected to the outer ring of the first annular region Z1. The radius of the outer ring of the second annular region Z2 is about 95 mm. The inner ring of the third annular region Z3 is connected to the outer ring of the second annular region Z2. The radius of the outer ring of the third annular region Z3 is about 125 mm. The inner ring of the fourth annular region Z4 is connected to the outer ring of the third annular region Z3. The radius of an outer ring of the fourth annular region Z4 is about 139 mm. The inner ring of the fifth annular region Z5 is connected to the outer ring of the fourth annular region Z4. The radius of the outer ring of the fifth annular region Z5 is about 145 mm. The inner ring of the sixth annular region Z6 is connected to the outer ring of the fifth annular region Z5. The radius of an outer ring of the sixth annular region Z6 is about 150 mm. Of course, in other example implementation modes of the disclosure, the grinding head 3 may include four, five, eight, or more regions. The size of each region may also be set to be larger or smaller according to needs.

The regions of the grinding head 3 may have different pressures. Table 1 shows pressure values needing to be applied to all the regions of the grinding head 3 under different thinning requirements. The unit of a numerical value in the table is pounds per square inch (PSI). In the example implementation mode, the sixth annular region Z6 may be the edge of the grinding head 3. Other parts may be the middle of the grinding head 3.

TABLE 1

| Condition | | Z6 | Z5 | Z4 | Z3 | Z2 | Z1 | $Z_{center}$ |
|---|---|---|---|---|---|---|---|---|
| Experiment 1 | −10 nm | 5.1 | 2.44 | 2.08 | 2.08 | 2.18 | 2.15 | 2.15 |
| Experiment 2 | −20 nm | 5.95 | 2.84 | 2.08 | 2.08 | 2.18 | 2.15 | 2.15 |
| Experiment 3 | −30 nm | 6.8 | 3.25 | 2.08 | 2.08 | 2.18 | 2.15 | 2.15 |

It can be seen from Table 1:

When the thickness of the edge of the first film layer at the edge of the wafer is reduced by 10 nm on average, the pressure on the sixth annular region Z6 may be 5.1; the pressure on the fifth annular region Z5 may be 2.44; the pressure on the fourth annular region Z4 may be 2.08; the pressure on the third annular region Z3 may be 2.08; the pressure on the second annular region Z2 may be 2.18; the pressure on the first annular region Z1 may be 2.15; and the pressure on the center region $Z_{center}$ may be 2.15.

When the thickness of the edge of the first film layer at the edge of the wafer is reduced by 20 nm on average, the pressure on the sixth annular region Z6 may be 5.95; the pressure on the fifth annular region Z5 may be 2.84; the pressure on the fourth annular region Z4 may be 2.08; the pressure on the third annular region Z3 may be 2.08; the pressure on the second annular region Z2 may be 2.18; the pressure on the first annular region Z1 may be 2.15; and the pressure on the center region $Z_{center}$ may be 2.15.

When the thickness of the edge of the first film layer at the edge of the wafer is reduced by 30 nm on average, the pressure on the sixth annular region Z6 may be 6.8; the pressure on the fifth annular region Z5 may be 3.25; the pressure on the fourth annular region Z4 may be 2.08; the pressure on the third annular region Z3 may be 2.08; the pressure on the second annular region Z2 may be 2.18; the pressure on the first annular region Z1 may be 2.15; and the pressure on the center region $Z_{center}$ may be 2.15.

Three example implementation modes are listed above for thinning the edge of the first film layer averagely by 10 nm, 20 nm and 30 nm, respectively. In other example implementation modes of the disclosure, the reduced thickness of the first film layer is not limited to the above explanation. By countless tests, an average reduced thickness of the first film layer may be greater than or equal to 10 nm and less than or equal to 40 nm, so that descriptions thereof are omitted here. During subsequent etching of the stacked film layer structure 5, due to non-uniform plasmas in the cavity and other reasons, a part of the stacked film layer structure 5 at where orthographic projection thereof locates at the edge of the wafer is etched relatively shallowly. The part is etched more shallowly with the increase of the distance from the center of the wafer. That is why it is required that after the first film layer is thinned, the thickness of the first film layer at where the orthographic projection of the first film layer on the wafer locates at the edge of the wafer is less than the thickness of the first film layer at where orthographic projection of the first film layer on the wafer locates in the middle of the wafer. The first film layer is thinner with the increase of the distance from the center point of the wafer.

Of course, in other example implementation modes of the disclosure, the thickness of the edge of the first film layer may be reduced by an etching method. A surface of the thinned edge of the first film layer away from the semiconductor structure 4 may be an annular slope, or an annular step plane, so that the first film layer is thinner with the increase of the distance the center point.

At S40, the stacked film layer structure 5 is patterned to form through holes 8 which communicate to the semiconductor structure 4.

Figure 9:
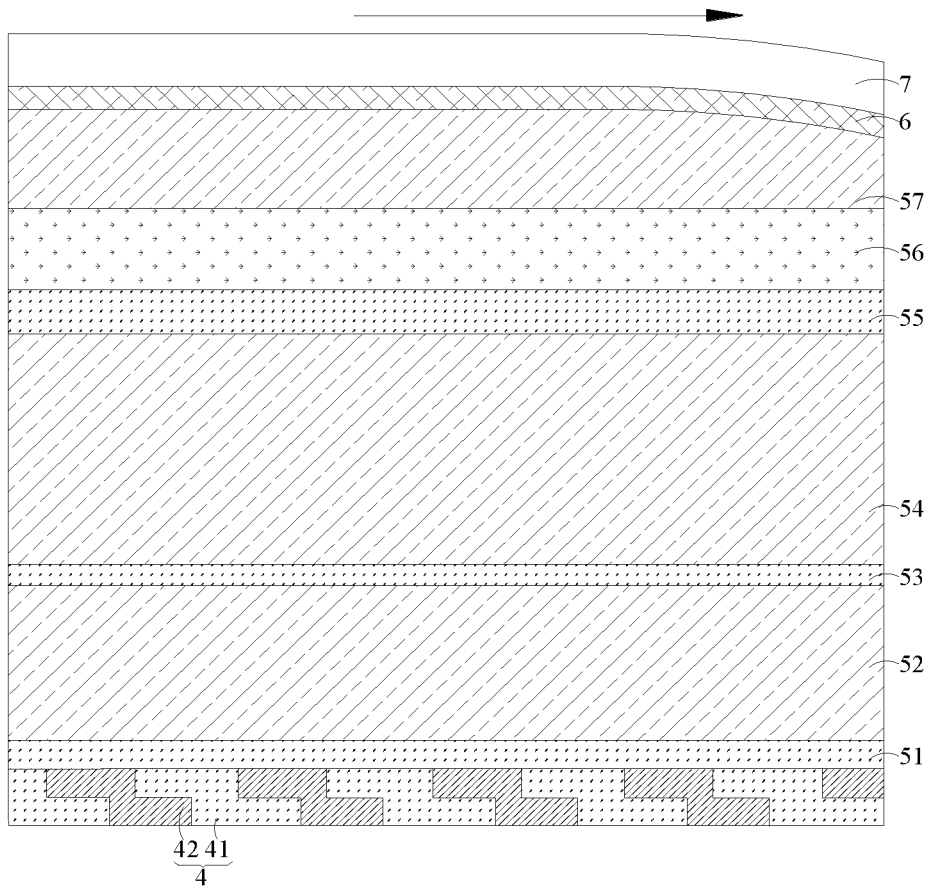
FIG. 9 is a schematic structural diagram of a semi-finished product of a semiconductor device with a mask layer and a photoresist layer formed on the basis of FIG. 6.

In the example implementation mode, referring to FIG. 9, firstly, a mask layer 6 may be deposited on a side of the stacked film layer structure 5 away from the semiconductor structure 4. A material of the mask layer 6 may be silicon oxynitride. A thickness of the mask layer 6 is about 30 to 50 nm. A photoresist layer 7 may be deposited on a side of the mask layer 6 away from the semiconductor structure 4. A thickness of the photoresist layer 7 is about 40 to 70 nm.

Figure 10:
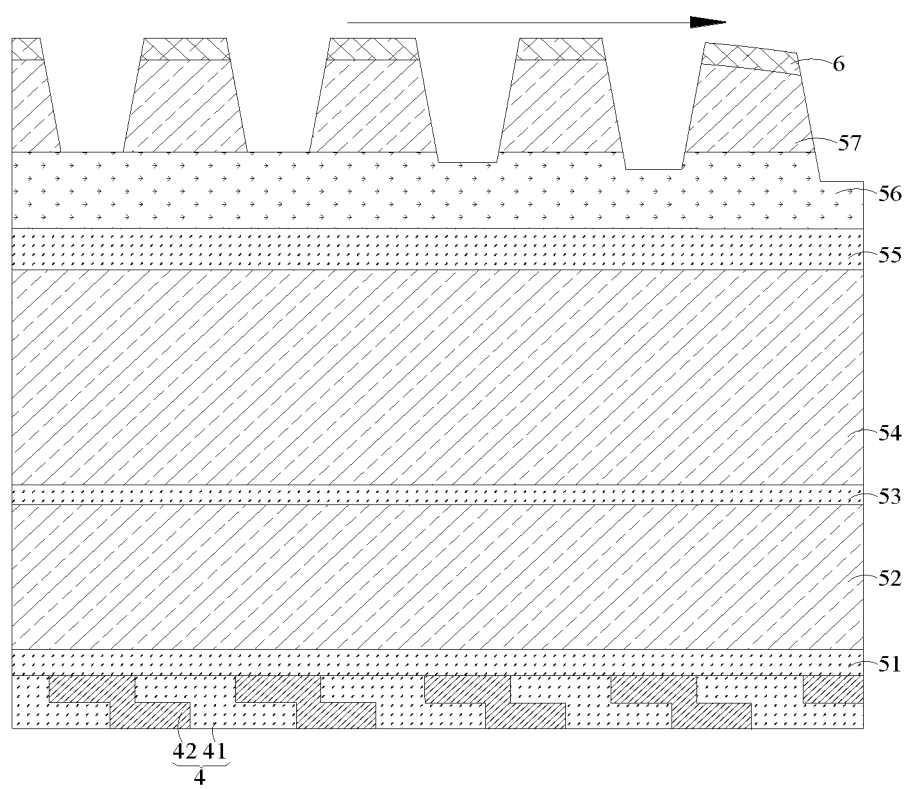
FIG. 10 is a schematic structural diagram of a semi-finished product of a semiconductor device with first etching completed on the basis of FIG. 9.

Then, the mask layer 6, the third supporting layer 57 and part of the dielectric layer 56 are etched by taking the photoresist layer 7 as a mask. Specifically, a mask plate is provided on the photoresist layer 7, and the photoresist layer 7 is treated by exposure. The photoresist layer that is not covered by the mask plate is removed. After that the mask plate is removed. The mask layer 6, the third supporting layer 57 and part of the dielectric layer 56 that are not covered by the photoresist layer 7 are etched. The remaining photoresist layer 7 is removed to form a semi-finished product shown in FIG. 10. It can be apparently obtained from the drawings that a deeper hole is formed by etching close to the edge.

Figure 11:
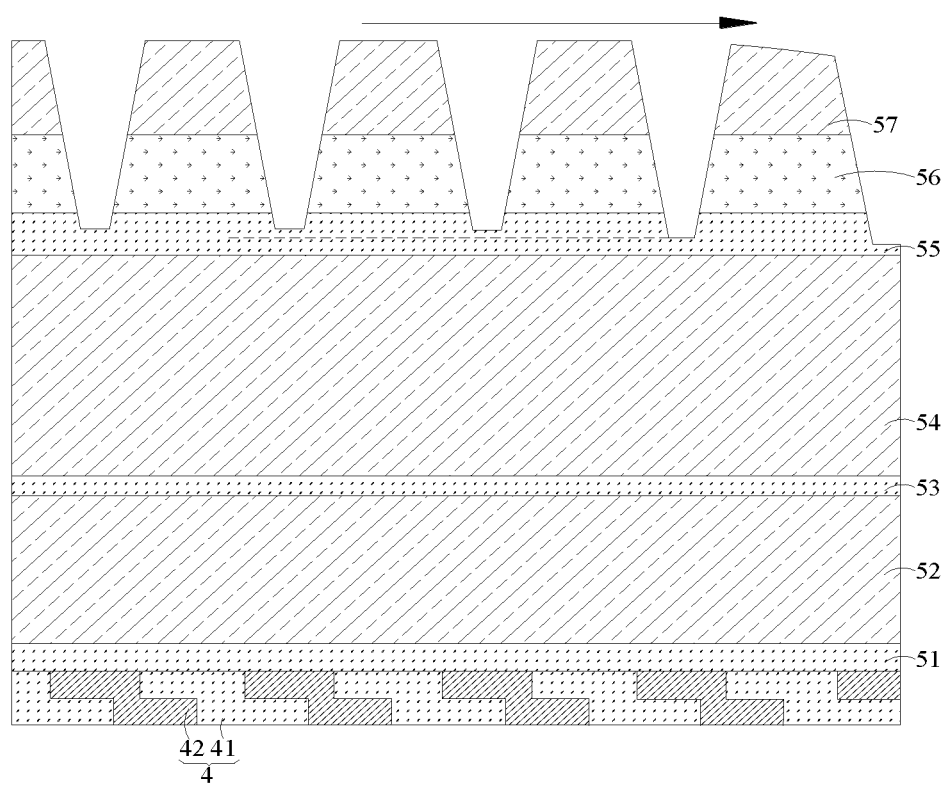
FIG. 11 is a schematic structural diagram of a semi-finished product of a semiconductor device with second etching completed on the basis of FIG. 10.

Secondly, the remaining part of the dielectric layer 56 and part of the third insulation layer 55 are etched by taking the third supporting layer 57 as a mask to form a semi-finished product shown in FIG. 11. It can be obtained by comparison of dotted lines in the figure that a deeper hole formed by etching close to the edge.

Figure 12:
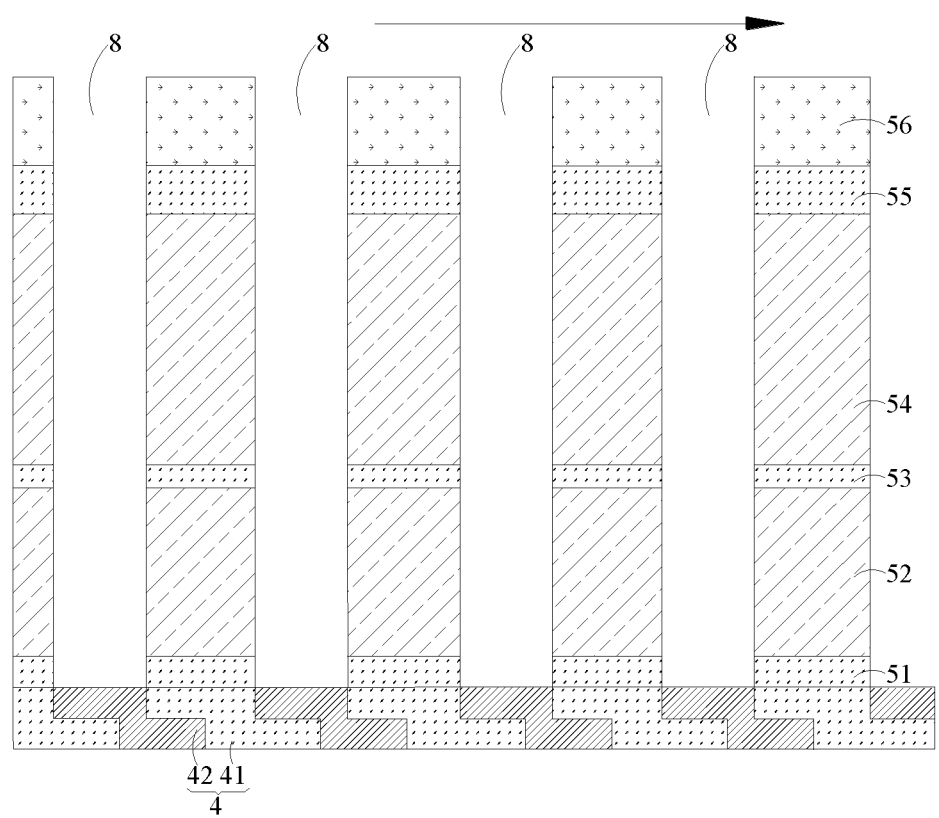
FIG. 12 is a schematic structural diagram of a semi-finished product of a semiconductor device with third etching completed on the basis of FIG. 11.

Thirdly, the remaining part of the third insulation layer 55, the second supporting layer 54, the second insulation layer 53, the first supporting layer 52, and the first insulation layer 51 are etched by taking the dielectric layer 56 as a mask to form through holes 8. The through holes 8 communicate to the capacitance contact structure 42 to form a semi-finished product structure shown in FIG. 12. Finally, the dielectric layer 56 is removed to form a structure shown in FIG. 13.

The method for preparing the semiconductor device may further include that capacitance structures are formed in the through holes 8. The capacitance structure is connected to the capacitance contact structure 42. Specifically, first electrodes are formed in through holes 8. An interlayer dielectric layer is formed on a side of the first electrode away from the stacked film layer structure 5. A second electrode is formed on a side of the interlayer dielectric layer away from the first electrode.

By multiple tests, it is found that when the edge of the first film layer is not thinned, there are 57 holes that have the shrinkage defect on average. When the edge of the first film layer is thinned by 10 nm on average, there are 7 holes that have the shrinkage defect on average. When the edge of the first film layer is thinned by 20 nm on average, there are 4 holes that have the shrinkage defect on average.

Figure 13:
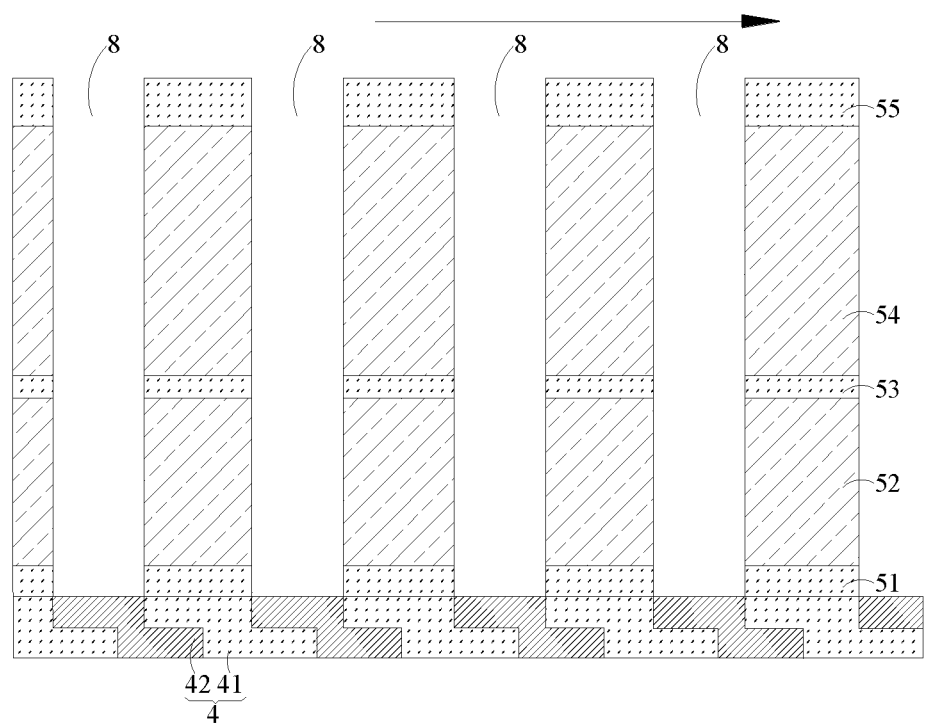
FIG. 13 is a schematic structural diagram of one example implementation mode of a semiconductor device of the disclosure.

Further, the disclosure further provides a semiconductor device. Referring to FIG. 13, which shows the schematic structural diagram of an example implementation mode of a semiconductor device of the disclosure, the semiconductor device is prepared by any one of the above-mentioned preparation methods. The finally formed through holes 8 of the semiconductor device prepared by the above-mentioned method will not have the shrinkage defect, so that the capacitance structures subsequently formed in the through holes 8 can be connected to the capacitance contact structures 42 to improve the yield of the semiconductor device. The specific structure of the semiconductor device has been described above in detail, so that repeated descriptions thereof are omitted here.

Further, the disclosure further provides a storage apparatus which may include the above-mentioned semiconductor device.

Compared with the related art, the beneficial effects of the storage apparatus provided by the example implementation mode of the disclosure are the same as the beneficial effects of the semiconductor device provided by the above example implementation mode, so that repeated descriptions thereof are omitted here.

The features, structures, or characteristics described above can be combined in one or more implementation modes in any suitable manner. If possible, the features discussed in all the embodiments are interchangeable. In the above description, many specific details are provided to give a sufficient understanding of the implementation modes of the disclosure. However, those skilled in the art will realize that the technical solutions of the disclosure can be practiced without one or more of the specific details, or other methods, components, devices, steps, etc. can be used. In other cases, well-known structures, materials or operations are not shown in detail in order to avoid obscuring aspects of the disclosure.

The terms "about" and "approximately" used in the present specification usually means within 20%, preferably within 10%, and more preferably within 5% of a given value or range. The quantity given here is an approximate quantity, which means that meanings of "about", "approximately", "substantially" and "probably" can still be implied in the absence of specific indications.

Although relative terms, such as "on" and "under", are used in the present specification to describe a relative relationship between one component and another component, these terms are used in the present specification only for convenience, for example, according to the directions of the examples in the drawings. It can be understood that if a device of an icon is turned upside down, an "on" component will become a "under" component. Other terms of relativity, such as "upper", "lower", "top", and "bottom", have similar meanings. When a certain structure is located "on" other structures, it may mean that the structure is integrally formed on other structures, or is "directly" disposed on other structures, or is "indirectly" disposed on other structures through another structure.

In the present specification, terms "a", "an", "the" and "said" are used to indicate the presence of one or more elements/components/etc. The terms "include", "comprise" and "have" are used to denote non-exclusive inclusion and means that in addition to the listed elements/components/etc., there may be other elements/components/etc. The terms "first", "second", "third" and the like are only used as markers, not as a restriction on the number of objects.

It should be understood that the disclosure does not limit its application to the detailed structure and arrangement of components proposed in the present specification. The disclosure can have other implementation modes, and can be implemented and executed in various ways. The aforementioned deformations and modifications fall within the scope of the disclosure. It should be understood that the disclosure disclosed and defined in the present specification extends to all alternative combinations of two or more individual features mentioned or apparent in the text and/or drawings. All these different combinations constitute multiple alternative aspects of the disclosure. The implementation modes described in the present specification illustrate the best way known for implementing the disclosure, and will enable those skilled in the art to utilize the disclosure.

The invention claimed is:

1. A method for preparing a semiconductor device, comprising:
   providing a wafer on which a semiconductor structure is formed;
   forming a stacked film layer structure on a side of the semiconductor structure away from the wafer, a film layer in the stacked film layer structure farthest from the semiconductor structure being a first film layer;
   reducing a thickness of the first film layer so that the thickness of the first film layer at where orthographic projection of the first film layer on the wafer locates at an edge of the wafer is less than the thickness of the first film layer at where orthographic projection of the first film layer on the wafer locates in middle of the wafer; and
   patterning the stacked film layer structure to form through holes which communicate to the semiconductor structure.

2. The method of claim 1, wherein said reducing a thickness of the first film layer comprises:
   reducing the thickness of the first film layer by a chemical mechanical grinding process.

3. The method of claim 2, wherein the reduction of the thickness is conducted by increasing a pressure at an edge of a grinding head of a chemical mechanical grinding device to make the pressure greater than a pressure in middle of the grinding head, so that the thickness of the first film layer at where the orthographic projection of the first film layer on the wafer locates at the edge of the wafer is less than the thickness of the first film layer at where the orthographic projection of the first film layer on the wafer locates in the middle of the wafer.

4. The method of claim 3, wherein the edge of the wafer is a part away from a center point of the wafer by a distance greater than or equal to a set value; and the middle of the wafer is a part away from the center point of the wafer by a distance less than the set value.

5. The method of claim 4, wherein orthographic projection of the edge of the grinding head on the wafer overlaps the edge of the wafer, and orthographic projection of the middle of the grinding head on the wafer overlaps the middle of the wafer.

6. The method of claim 1, wherein after the thickness of the first film layer is reduced, the first film layer at where the orthographic projection of the first film layer locates at the edge of the wafer has an annular arc surface away from the semiconductor structure, and is thinner with an increase of a distance from a center point of the wafer.

7. The method of claim 1, wherein said forming a stacked film layer structure on a side of the semiconductor structure away from the wafer comprises:
   forming a first insulation layer on the side of the semiconductor structure away from the wafer;
   forming a first supporting layer on a side of the first insulation layer away from the semiconductor structure;
   forming a second insulation layer on a side of the first supporting layer away from the semiconductor structure;
   forming a second supporting layer on a side of the second insulation layer away from the semiconductor structure;
   forming a third insulation layer on a side of the second supporting layer away from the semiconductor structure;
   forming a dielectric layer on a side of the third insulation layer away from the semiconductor structure; and
   forming a third supporting layer on a side of the dielectric layer away from the semiconductor structure;
   wherein the third supporting layer is the first film layer.

8. The method of claim 7, wherein said patterning the stacked film layer structure to form through holes comprises:
   forming a mask layer on a side of the stacked film layer structure away from the semiconductor structure;
   forming a photoresist layer on a side of the mask layer away from the semiconductor structure;
   etching the mask layer, the third supporting layer and part of the dielectric layer by taking the photoresist layer as a mask;

etching remaining part of the dielectric layer and part of the third insulation layer by taking the third supporting layer as a mask; and etching remaining part of the third insulation layer, the second supporting layer, the second insulation layer, the first supporting layer and the first insulation layer by taking the dielectric layer as a mask to form the through holes.

9. The method of claim 1, wherein the semiconductor structure comprises a capacitance contact structure; and after the stacked film layer structure is patterned to form the through holes, the through holes communicate to the capacitance contact structure so that a surface of the capacitance contact structure away from the wafer is exposed.

10. A semiconductor device, prepared by the method of claim 1.

11. A storage apparatus, comprising the semiconductor device of claim 10.

* * * * *